(12) United States Patent
Katagiri et al.

(10) Patent No.: US 9,355,900 B2
(45) Date of Patent: May 31, 2016

(54) SEMICONDUCTOR DEVICE AND METHOD OF MANUFACTURING THE SAME

(71) Applicant: Kabushiki Kaisha Toshiba, Minato-ku (JP)

(72) Inventors: Masayuki Katagiri, Kanagawa (JP); Yuichi Yamazaki, Tokyo (JP); Tadashi Sakai, Kanagawa (JP); Naoshi Sakuma, Kanagawa (JP); Mariko Suzuki, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/803,229

(22) Filed: Jul. 20, 2015

(65) Prior Publication Data

US 2015/0325476 A1     Nov. 12, 2015

Related U.S. Application Data

(62) Division of application No. 13/950,442, filed on Jul. 25, 2013, now Pat. No. 9,123,720.

(30) Foreign Application Priority Data

Oct. 25, 2012    (JP) .................................. 2012-235546

(51) Int. Cl.
*H01L 21/768* (2006.01)
*H01L 21/285* (2006.01)
(Continued)

(52) U.S. Cl.
CPC ...... *H01L 21/76877* (2013.01); *H01L 21/2855* (2013.01); *H01L 21/28556* (2013.01); *H01L 21/76838* (2013.01); *H01L 21/76843* (2013.01); *H01L 21/76846* (2013.01); *H01L 21/76876* (2013.01); *H01L 21/76879* (2013.01);
(Continued)

(58) Field of Classification Search
CPC ............ H01L 29/0669; H01L 51/0048; H01L 29/413; H01L 51/444; H01L 51/0045; H01L 2221/1094; H01L 2224/05193; H01L 2224/05293; H01L 2224/37193; H01L 23/481; H01L 23/5226; C01B 31/0206
See application file for complete search history.

(56) References Cited

U.S. PATENT DOCUMENTS

2008/0237858 A1    10/2008    Nihei
2011/0006425 A1     1/2011    Wada et al.
(Continued)

FOREIGN PATENT DOCUMENTS

JP    2008-258187 A    10/2008
JP    2010-177405        8/2010
(Continued)

OTHER PUBLICATIONS

Japanese Office Action issued Mar. 11, 2014 in Patent Application No. 2012-235546 (w/English translation).

*Primary Examiner* — Peniel M Gumedzoe
(74) *Attorney, Agent, or Firm* — Oblon, McClelland, Maier & Neustadt, L.L.P.

(57) ABSTRACT

A semiconductor device of an embodiment includes: a substrate on which a semiconductor circuit is formed; an interlayer insulating film in which a contact hole is formed on the substrate; a catalyst metal film on a side wall of the contact hole; catalyst metal particles on a bottom of the contact hole; graphene on the catalyst metal film; and carbon nanotubes, which penetrates the contact hole, on the catalyst metal particles.

15 Claims, 11 Drawing Sheets

(51) Int. Cl.
- H01L 23/532 (2006.01)
- H01L 23/522 (2006.01)
- *H01L 51/00* (2006.01)
- *C01B 31/02* (2006.01)
- *H01L 51/44* (2006.01)
- *H01L 29/06* (2006.01)
- *H01L 29/41* (2006.01)

(52) U.S. Cl.
CPC ...... *H01L23/5226* (2013.01); *H01L 23/53276* (2013.01); *C01B 31/0206* (2013.01); *H01L 29/0669* (2013.01); *H01L 29/413* (2013.01); *H01L 51/0048* (2013.01); *H01L 51/444* (2013.01); *H01L 2221/1094* (2013.01); *H01L 2924/0002* (2013.01)

(56) References Cited

U.S. PATENT DOCUMENTS

| | | |
|---|---|---|
| 2012/0049370 A1 | 3/2012 | Wada et al. |
| 2014/0061916 A1 | 3/2014 | Saito et al. |

FOREIGN PATENT DOCUMENTS

| | | |
|---|---|---|
| JP | 2011-187722 | 9/2011 |
| JP | 2012-49261 | 3/2012 |

SEMICONDUCTOR DEVICE AND METHOD OF MANUFACTURING THE SAME

CROSS-REFERENCE TO RELATED APPLICATION

This application is a division of and claims the benefit of priority under 35 U.S.C. §120 from U.S. Ser. No. 13/950,442 filed Jul. 25, 2013, and claims the benefit of priority under 35 U.S.C. §119 from Japanese Patent Applications No. 2012-235546 filed Oct. 25, 2012; the entire contents of each of which are incorporated herein by reference.

FIELD

Embodiments described herein relate generally to a semiconductor device and a method of manufacturing the same.

BACKGROUND

Increase in wiring delay in metal wiring with miniaturized multi-layered LSI and 3D memory is a large problem. In order to decrease the wiring delay, it is important to decrease wiring resistance and interwire capacitance. Application of a low-resistance material such as Cu, for example, is put into practical use for decreasing the wiring resistance. However, also in Cu wiring, deterioration in reliability due to stress migration and electromigration, increase in electric resistivity due to a size effect and the like become problematic, so that a low-resistance wiring material excellent in current density tolerance is required.

Application of a carbon-based material such as carbon nanotubes and graphene with excellent physical properties such as high current density tolerance, electric conduction property, thermal conductivity, and mechanical strength attracts attention as a next-generation wiring material expected to be a low-resistance and highly reliable material. Especially, a structure in which the carbon nanotubes is used as longitudinal interlayer wiring and the graphene is used as transverse wiring is being studied.

DETAILED DESCRIPTION

Figure 1:
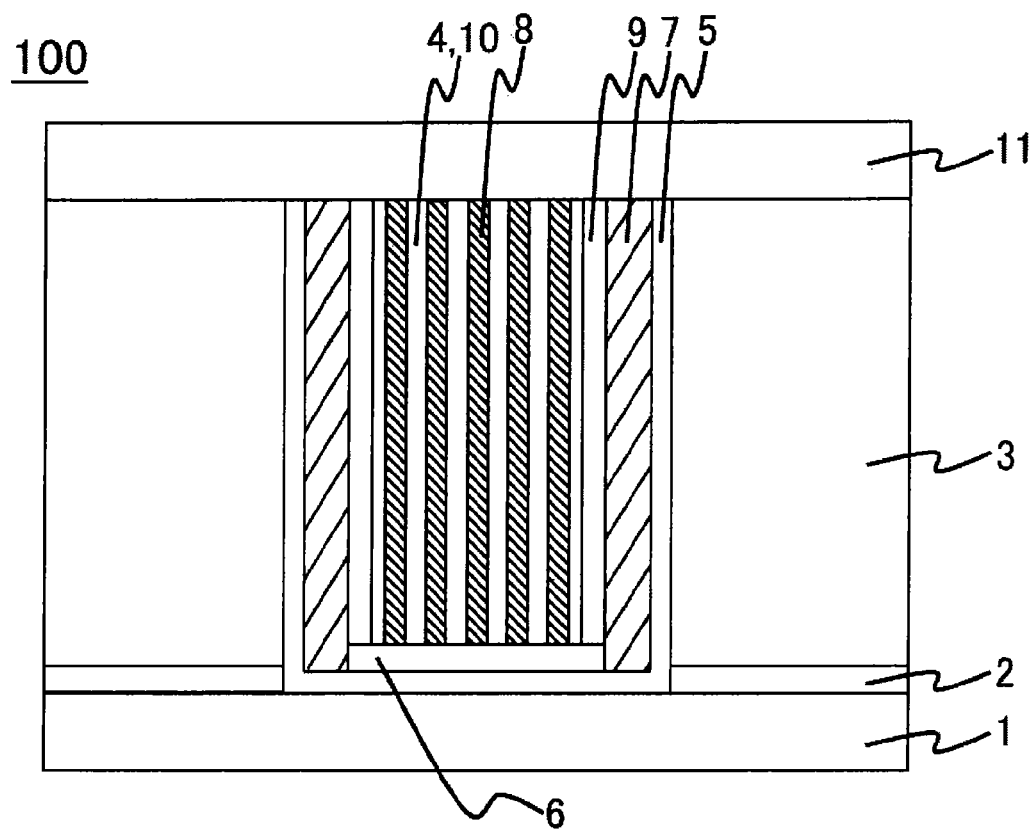
FIG. 1 is a cross-sectional conceptual diagram of a semiconductor device including wiring of an embodiment.

A semiconductor device of an embodiment includes: a substrate on which a semiconductor circuit is formed; an interlayer insulating film in which a contact hole is formed on the substrate; a catalyst metal film on a side wall of the contact hole; catalyst metal particles on a bottom of the contact hole; graphene on the catalyst metal film; and carbon nanotubes, which penetrates the contact hole, on the catalyst metal particles.

Embodiments of the invention will be described below with reference to the drawings. The embodiments (examples) are illustrative and the scope of the disclosure is not limited thereto. The drawings are illustrative. Meanwhile, the drawings are symmetric and the same reference signs are omitted. A configuration such as a shape, a size, and a number in the drawing is not necessarily the same as that of an actual semiconductor device.

(First Example)

FIG. 1 is a cross-sectional conceptual diagram of an interlayer wiring unit of a semiconductor device of a first example and is a cross-sectional view of a part including interlayer wiring of the semiconductor device of an embodiment. The semiconductor device of the first example is provided with a substrate 1 on which a semiconductor circuit is formed, an interlayer insulating film 3 in which a contact hole 4 is formed on the substrate, a catalyst metal film on a side wall of the contact hole, catalyst metal particles on a bottom of the contact hole 4, graphene 9 on the catalyst metal film, and carbon nanotubes 8, which penetrates the contact hole 4, on the catalyst metal particles, for example. An etching stop film 2 may be provided between the substrate 1 and the interlayer insulating film 3. An embedded film 10 may be provided in the contact hole 4 and an upper substrate 11 or upper layer wiring 11 may be provided on the contact hole 4, wiring 8 and 9 in the contact hole 4, and the interlayer insulating film 3 as illustrated in FIG. 1. There are an LSI, a 3D memory and the like as the semiconductor device. Meanwhile, the embodiment may be the wiring without the semiconductor device in a configuration in FIG. 1.

A method of manufacturing a semiconductor device 100 of the first example includes a step of forming the substrate 1 on which the semiconductor circuit is formed and the contact hole 4, which penetrates the interlayer insulating film 3 of a member provided with the interlayer insulating film 3 on the substrate 1, a step of forming a conductive film 5 on the contact hole 4, a step of forming the catalyst metal film on the conductive film 5 by a CVD (chemical vapor deposition) method, a step of depositing catalyst metal on the side wall of the contact hole 4 of the catalyst metal film by a PVD (physical vapor deposition) method, and a step of growing the graphene 9 and the carbon nanotubes 8 from the side wall and the bottom of the contact hole 4, respectively, for example.

Steps of fabricating the semiconductor device 100 including the wiring of the first example are described with reference to step cross-sectional conceptual diagrams in FIGS. 2 to 7.

Figure 2:
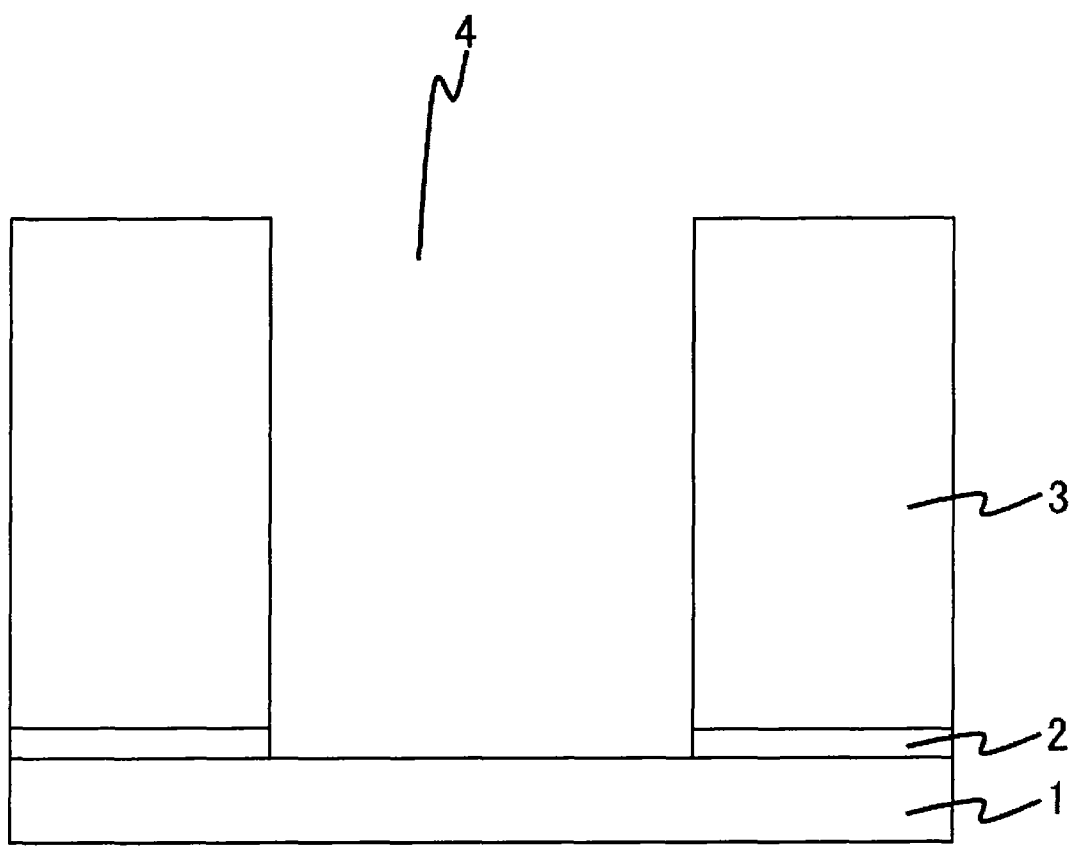
FIG. 2 is a step cross-sectional conceptual diagram of a method of manufacturing the wiring of the semiconductor device including the embodiment.

FIG. 2 is the cross-sectional conceptual diagram of a step of forming the contact hole 4 in the member in which the etching stop film 2 and the interlayer insulating film 3 are formed on an underlying wiring substrate 1 according to the first example. The contact hole 4 is formed on the member in which the etching stop film 2 is formed on the underlying wiring substrate on which a semiconductor integrated circuit and the like is formed and the interlayer insulating film 3 is formed on the etching stop film 2 so as to penetrate the interlayer insulating film 3. The underlying wiring substrate 1 is one layer of a multi-layer substrate such as the LSI and the 3D memory, for example. The etching stop film may be formed of a material with which the underlying wiring substrate 1 is not etched. A low-dielectric insulating film such as SiOC may be adopted as the interlayer insulating film 3, for example, and the film is not especially limited thereto. The contact hole 4 is formed by dry etching using fluorinated gas, for example. A diameter of the contact hole 4 is 100 nm, for example, and a depth of the contact hole 4 is 1 µm, for example.

Figure 3:
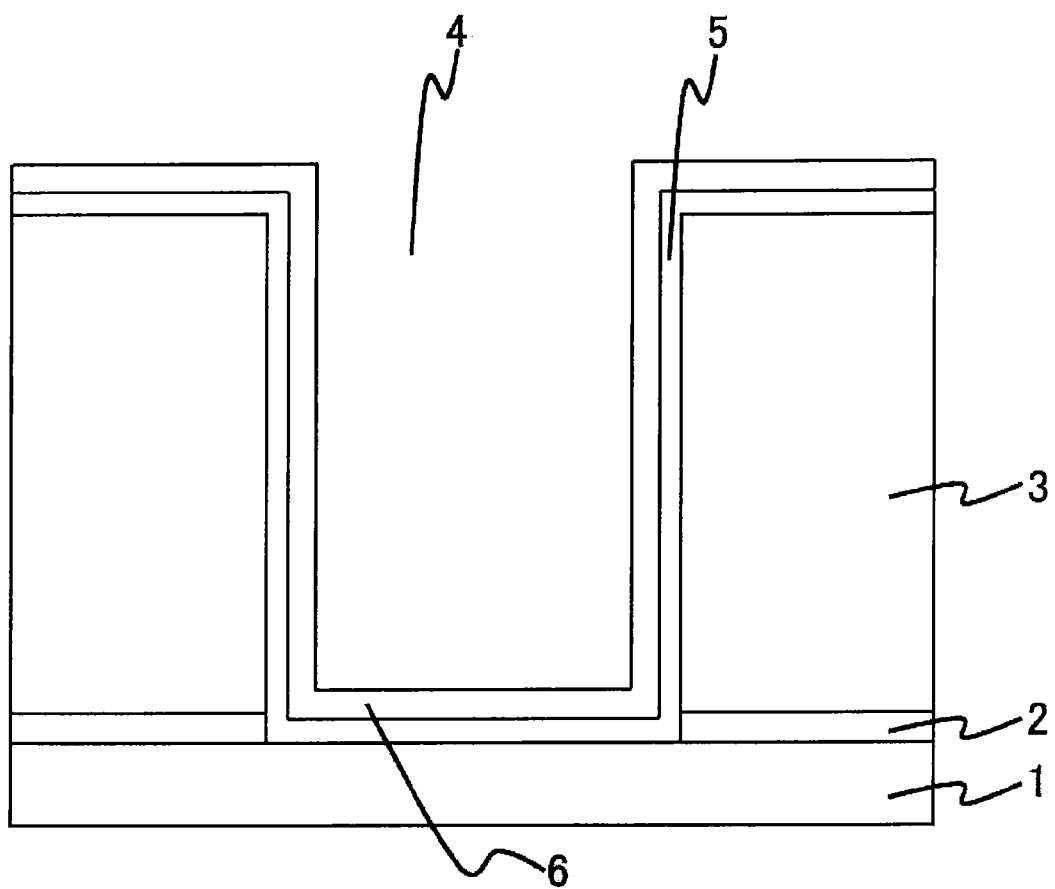
FIG. 3 is a step cross-sectional conceptual diagram of the method of manufacturing the wiring of the semiconductor device including the embodiment.

FIG. 3 is the cross-sectional conceptual diagram of a step of forming the conductive film 5 and a catalyst metal film 6 on the contact hole 4 of the member in which the contact hole 4 is formed according to the first example.

The conductive film 5 and the catalyst metal film 6 are formed on an entire surface including the contact hole 4 as illustrated in FIG. 3. A film forming method such as PVD or CVD (chemical vapor deposition) may be adopted in general as the method of forming the metal film. However, when an aspect ratio (contact hole height/contact hole diameter) of the contact hole 4 is large, it is difficult to form the conductive film 5 and the catalyst metal film 6 on the bottom of the contact hole by the PVD such as sputtering with low step coatability, so that film formation by the CVD with excellent step coatability is desirable. The conductive film 5 stabilizes and improves conductivity of the interlayer wiring, so that this is preferably used under the catalyst metal film 6; however, the conductive film 5 may be omitted. A thickness of the conductive film 5 is not less than 0.5 nm and not more than 10 nm, for example. The conductive film 5 may have a structure in which a plurality of different conductive materials is laminated. A metal film may be used as the conductive film 5 and the metal film, which is a promoter catalyst of growth of the carbon nanotubes 8 or the graphene 9, is preferable. For the above-described reason, the conductive film 5 is preferably a metal film, an alloy film, or a metal nitride film containing one or more elements selected from a group including Ti, Ta, Mn, Mo, V, Ru, and Cu among the metal films. Further, for the above-described reason, the conductive film 5 is more preferably the metal film, the alloy film, or the metal nitride film composed of one or more elements selected from the group including Ti, Ta, Mn, Mo, V, Ru, and Cu and an inevitably contained element. The catalyst metal film 6 is preferably a thin film, which may be easily atomized, the film containing the element with which the carbon nanotube 8 may be grown. For the above-described reason, the metal film or the alloy film containing one or more elements selected from a group including Co, Ni, and Fe is preferable. Further, for the above-described reason, the metal film or the alloy film composed of one or more elements selected from the group including Co, Ni, and Fe and the inevitably contained element is preferable. A thickness of the catalyst metal film 6 is preferably not less than 1 nm and not more than 4 nm on average, for example. An area in which the catalyst metal film 6 is thick is not suitable for the growth of the carbon nanotubes 8, so that it is preferable that 80% of an entire area of the catalyst metal film on the bottom of the contact hole 4 satisfies the above-described range and that a maximum value of the film thickness is not more than 10 nm even when the catalyst for the growth of the carbon nanotubes 8 is separately atomized. The catalyst metal film 6 deposited on the side wall of the contact hole 4 is integrated with the catalyst metal deposited at a next step.

Thicknesses of the catalyst metal films 6 and 7 and average values thereof may be measured from a cross-sectional TEM (transmission electron microscope) image. Also, density of the carbon nanotubes 8 and the number of layers of the graphene 9 on the side wall of the contact hole 4 may be known from the cross-sectional TEM image.

Figure 4:
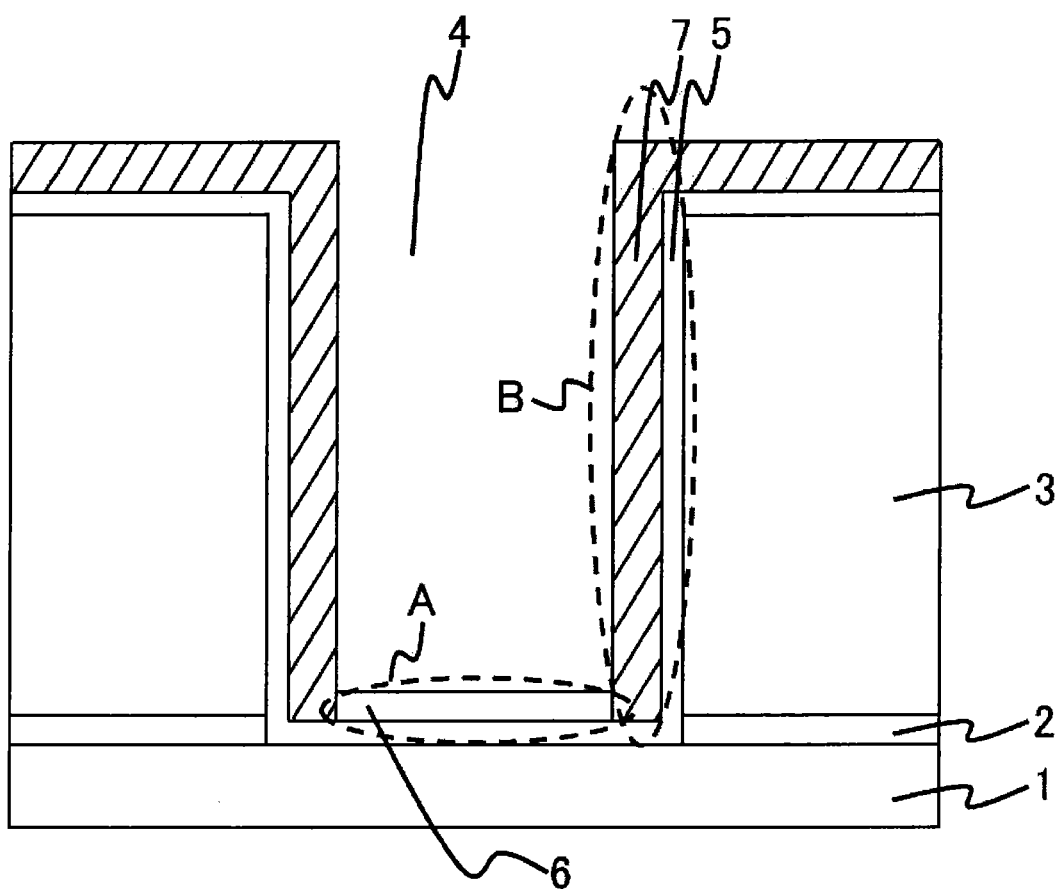
FIG. 4 is a step cross-sectional conceptual diagram of the method of manufacturing the wiring of the semiconductor device including the embodiment.

FIG. 4 is the cross-sectional conceptual diagram of a step of forming the catalyst metal film 7 by the PVD on the contact hole 4 of the member on which the catalyst metal film 6 is formed according to the first example.

Next, the catalyst metal film 7 composed of the same element as the element cited for the catalyst metal film 6 is formed on a portion other than the bottom of the contact hole as illustrated in FIG. 4. Herein, when the aspect ratio (depth/diameter) of the contact hole 4 is large, it is possible to form the catalyst metal film 7 on the portion other than the bottom of the contact hole 4 using the PVD such as the sputtering with the low step coatability. Meanwhile, the side wall of the contact hole 4 is an area B in FIG. 4 of a wall surface of the contact hole 4 other than an area A in FIG. 4 of the bottom on a side of the substrate 1 of the contact hole 4 formed in the interlayer insulating film 3. On the other hand, when the aspect ratio of the contact hole 4 is smaller than 2, the catalyst metal is deposited also on the bottom of the contact hole 4 by the sputtering. The aspect ratio not smaller than 2 of the contact hole is suitable as a condition to make the film thickness of the catalyst metal on the side wall of the contact hole 4 and that of the catalyst metal on the bottom different from each other at this step. When the aspect ratio of the contact hole 4 is too large, there is a case in which the catalyst metal is not deposited up to the film thickness suitable for the growth of the graphene on a lower portion of the side wall of the contact hole 4. The CVD excellent in the step coatability deposits the catalyst metal also on the bottom of the contact hole, so that this is not suitable at this step. The catalyst metal film 7 on the side wall of the contact hole is thicker than the catalyst metal film 6 for the growth of the carbon nanotubes 8 on the bottom of the contact hole. When the film is thick, the atomization of the catalyst metal film 7 does not easily occur, so that the catalyst metal film 7 is the catalyst with which the graphene 9 is easily grown at this step. From a viewpoint of forming a minute contact hole 4, the film thickness of the catalyst metal film 7 for the growth of the graphene 9 is preferably approximately not less than 5 nm and not more than 20 nm on average, for example. In order to grow excellent graphene 9, it is preferable that the film thickness is relatively uniform and that 80% of the entire area of the catalyst metal film 7 satisfies the above-described range. In the case of the contact hole 4 with a large diameter not less than 500 nm, the film may be thicker. The catalyst metal film 7 for the growth of the graphene is desirably a continuous film for the growth of the graphene of a large area. The term "continuous film" is intended to mean the film without discontinuity.

Figure 5:
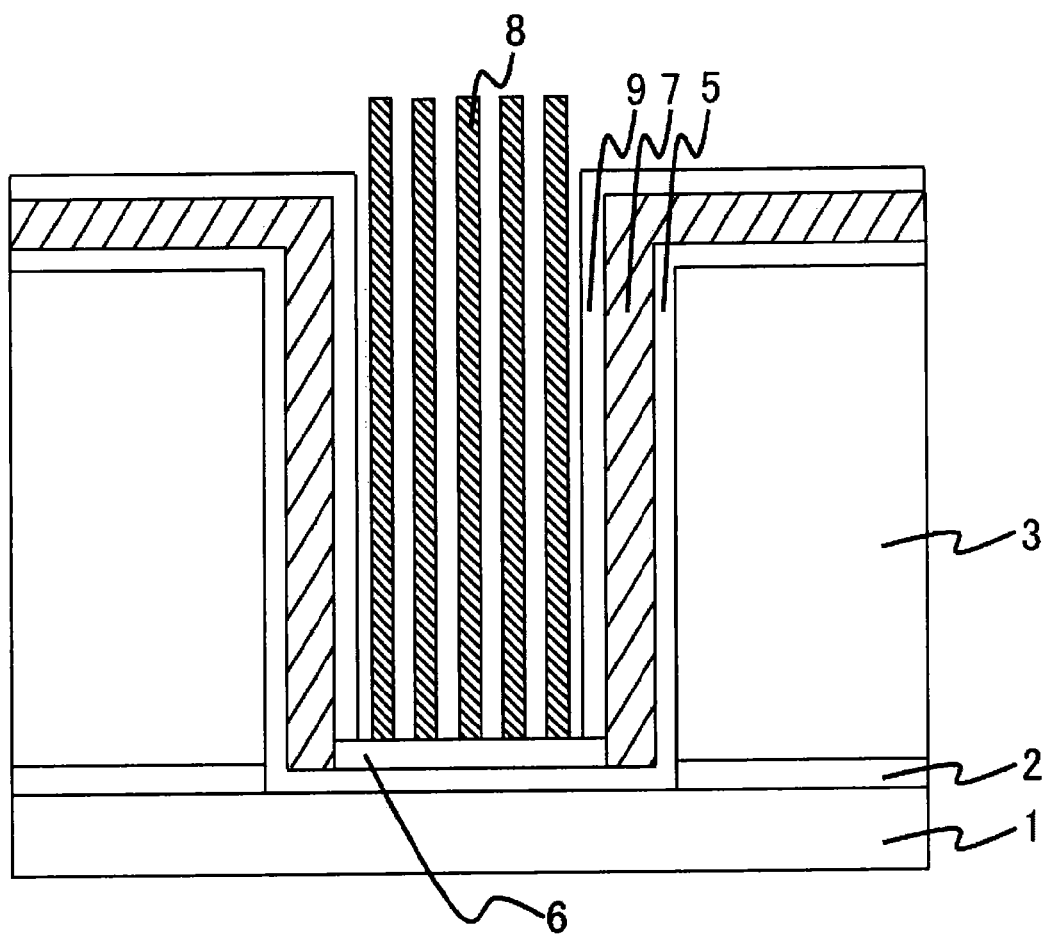
FIG. 5 is a step cross-sectional conceptual diagram of the method of manufacturing the wiring of the semiconductor device including the embodiment.

As illustrated in FIG. 5, the carbon nanotubes 8 is grown from the catalyst metal film 6 formed on the bottom of the contact hole and the graphene 9 is grown from the catalyst metal film 7 formed on the side wall of the contact hole. The carbon nanotubes 8 and the graphene 9 are grown by a thermal CVD method and a plasma CVD method, for example. When the plasma CVD method is used, the substrate is heated up to 500° C., for example, in a reacting furnace, hydrocarbon gas such as methane gas as material gas and hydrogen as carrier gas are introduced, the methane gas is excited and discharged by a microwave, for example, to generate plasma of the material gas, and this is allowed to react with the catalyst metal film to grow the carbon nanotubes 8 and the graphene 9. The carbon nanotubes 8 are grown from the catalyst metal obtained by aggregation and atomization of the catalyst metal film by thermal or plasma energy. At the time of the growth of the carbon nanotubes 8, it is possible to separately apply plasma surface treatment to atomize the catalyst metal film 6 or atomize the catalyst metal film 6 by a process of the growth of the carbon nanotubes 8. The material gas of the plasma is preferably hydrogen or rare gas such as argon, for example; however, this may be mixed gas including any one of or both of them. At that time, the substrate 1 may be heated. The graphene 9 preferably has a multi-layer structure, and when the diameter of the contact hole is 100 nm, the height of the hole is 1000 nm, the film thickness of the catalyst metal film 7 is 10 nm, and the density of the carbon nanotubes 8 in the hole is $1 \times 10^{12}$ $cm^{-2}$, decrease in effective contact hole diameter by the catalyst metal film on the side wall may be compensated if the number of layers of the graphene 9 is approximately 24. In order to grow the multi-layer graphene 9, a facet, which serves as a growth starting point, is preferably formed on the catalyst metal film 7. Meanwhile, it is possible to distinguish between the graphene 9 and the carbon nanotubes 8 generated on the catalyst metal film by cross-sectional TEM observation to know the density of the carbon nanotubes 8 and the number of layers of the graphene.

Figure 6:
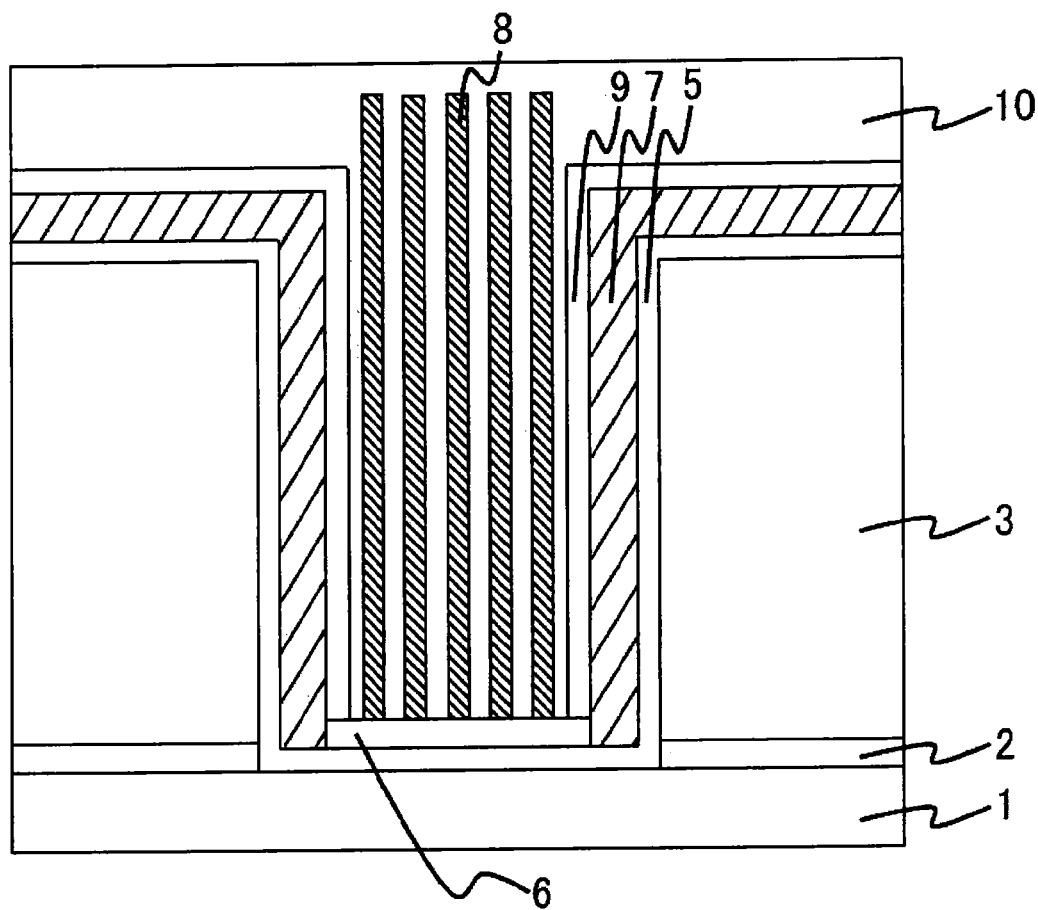
FIG. 6 is a step cross-sectional conceptual diagram of the method of manufacturing the wiring of the semiconductor device including the embodiment.

FIG. 6 illustrates a step of forming the embedded film of the first example. The embedded film 10 is formed for fixing the carbon nanotubes 8 in order to polish in an excellent manner at the time of planarization by CMP (chemical mechanical polishing). The embedded film may be formed of an insulating material or a conductive material and an SOD (spin on dielectric) being a coat-type insulating film, for example, is formed by spin coating. After the spin coating, it is hardened at 400° C., for example.

Figure 7:
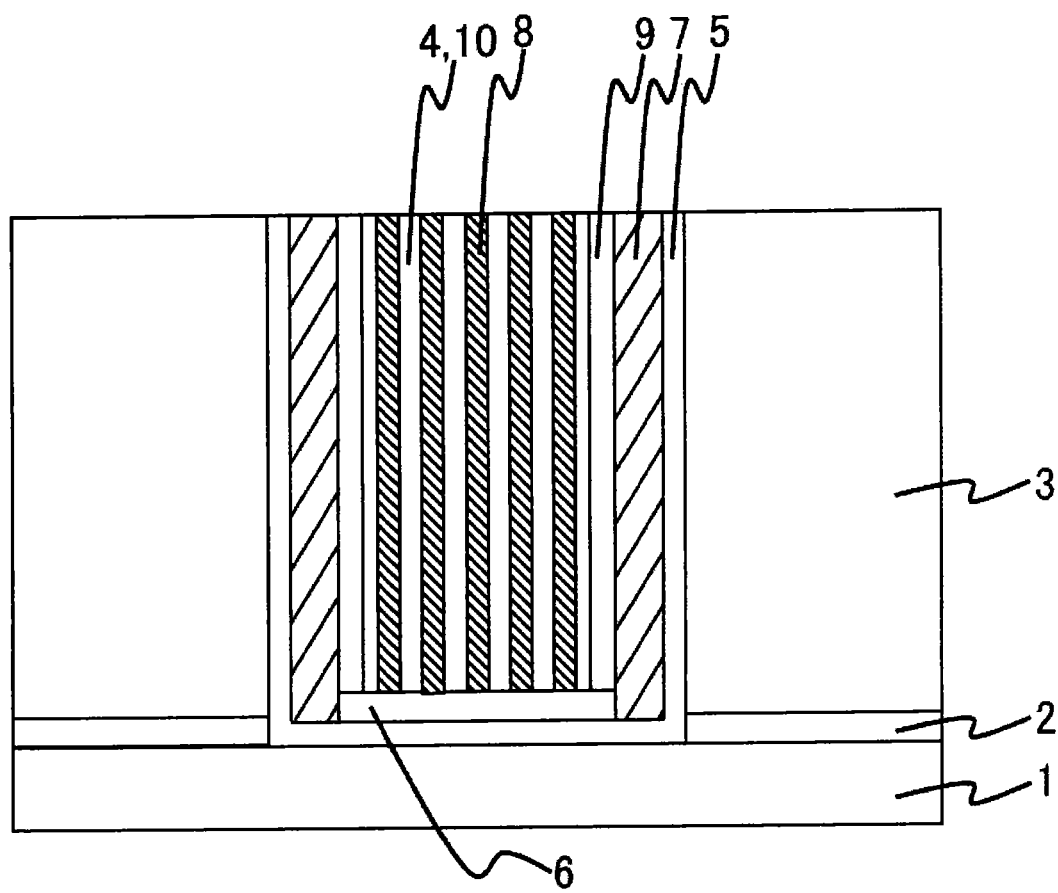
FIG. 7 is a step cross-sectional conceptual diagram of the method of manufacturing the wiring of the semiconductor device including the embodiment.

Next, as illustrated in FIG. 7, the planarization is performed by the CMP, and a wiring structure in which the carbon nanotube 8 and the embedded film 10 are formed in the contact hole 4 and the graphene 9 is formed on the side wall of the contact hole 4 is obtained.

Next, it is possible to obtain the semiconductor device including the wiring structure in which the graphene 9 and the carbon nanotubes 8 are used illustrated in FIG. 1 by forming the upper layer wiring 11 on the carbon nanotubes 8 and an upper portion of the embedded film 10 and on an edge of the conductive film 5, the catalyst metal film 7, and the graphene 9 formed on the side wall. At that time, the upper layer wiring 11 is desirably formed of a material such as Ti, for example, which may form an excellent contact with the carbon nanotubes 8 and the graphene 9.

The semiconductor device of the embodiment includes the graphene 9 with high mechanical strength on the side wall of the contact hole 4. Therefore, this has an advantage that structural stability of the contact hole is improved and a polishing step such as the CMP may be stably performed, and highly-conducting interlayer wiring formed of the carbon nanotubes 8 and the graphene 9 may be realized.

(Second Example)

A method of manufacturing a semiconductor device of this example includes a step of forming a substrate 1 on which a semiconductor circuit is formed and a contact hole 4, which penetrates an interlayer insulating film 3 of a member provided with the interlayer insulating film 3 on the substrate 1, a step of forming a conductive film 5 on the contact hole 4, a step of forming a catalyst metal film on the conductive film 5 by a CVD method, a step of thinning the catalyst metal film on a bottom of the contact hole 4, and a step of growing carbon nanotubes 8 and graphene 9 from the bottom and a side wall of the contact hole 4, respectively, for example.

Figure 8:
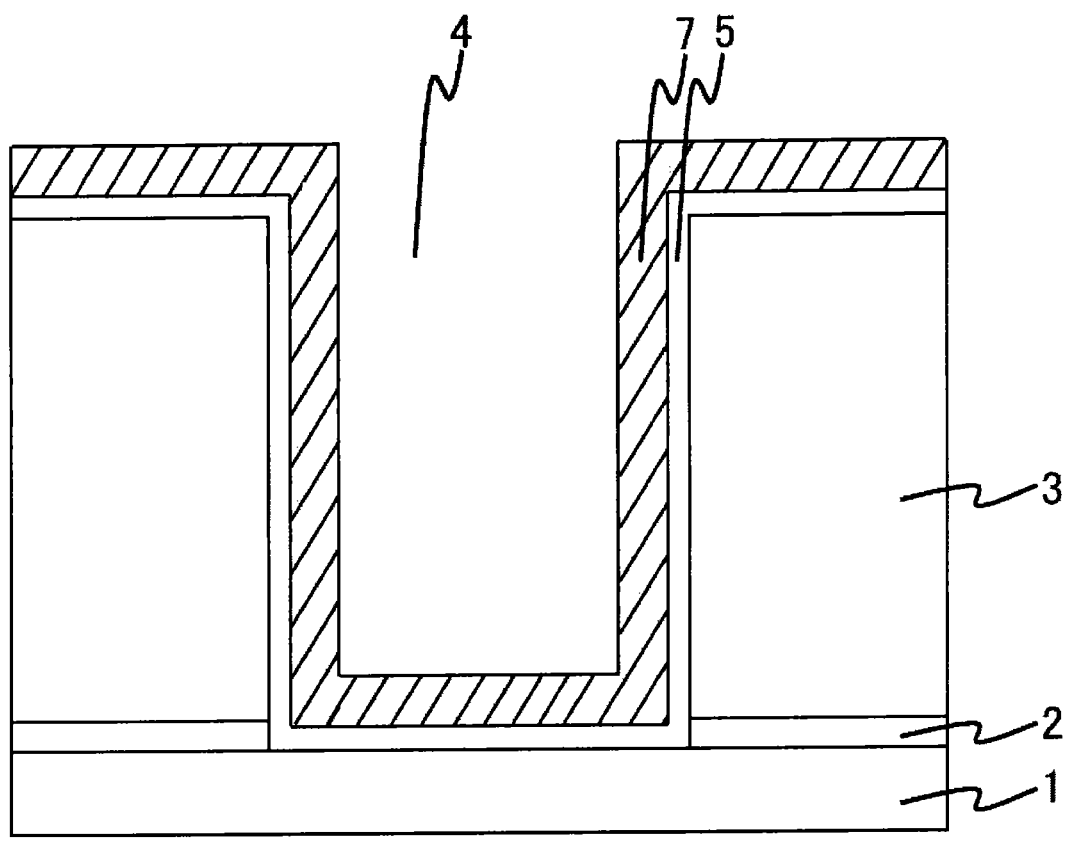
FIG. 8 is a step cross-sectional conceptual diagram of the method of manufacturing the wiring of the semiconductor device including the embodiment.

The second example is similar to the first example except that the manufacturing method is partly different from that of the first example. The steps are similar to those of the first example up to the step of forming the contact hole 4, so that the description up to the step of forming the contact hole 4 and the common feature are omitted. The conductive film 5 and a catalyst metal film 7 are formed on an entire surface including the contact hole 4 as illustrated in FIG. 8. Herein, the conductive film 5 and the catalyst metal film 7 are desirably formed to have a uniform film thickness by CVD with excellent step coatability. The film thickness of the catalyst metal film 7 is not less than 5 nm and not more than 20 nm, for example, and this is thicker than a film thickness of a catalyst metal film 6 for growth of the carbon nanotubes 8 on the bottom of the contact hole described in the first example such that atomization does not occur and the graphene 9 is easily grown. From a viewpoint of forming a minute contact hole 4, the film thickness of the catalyst metal film 7 for the growth of the graphene is preferably approximately not less than 5 nm and not more than 10 nm, for example. Also, the catalyst metal film 7 for the growth of the graphene 9 is desirably a continuous film for the growth of the graphene 9 of a large area. The term "continuous film" is intended to mean the film without discontinuity. When the catalyst metal film 7 becomes thinner at a next step, it is preferable to adjust the film thickness of the catalyst metal film in advance so as to be not less than 5 nm and not more than 20 nm after a next step.

Figure 9:
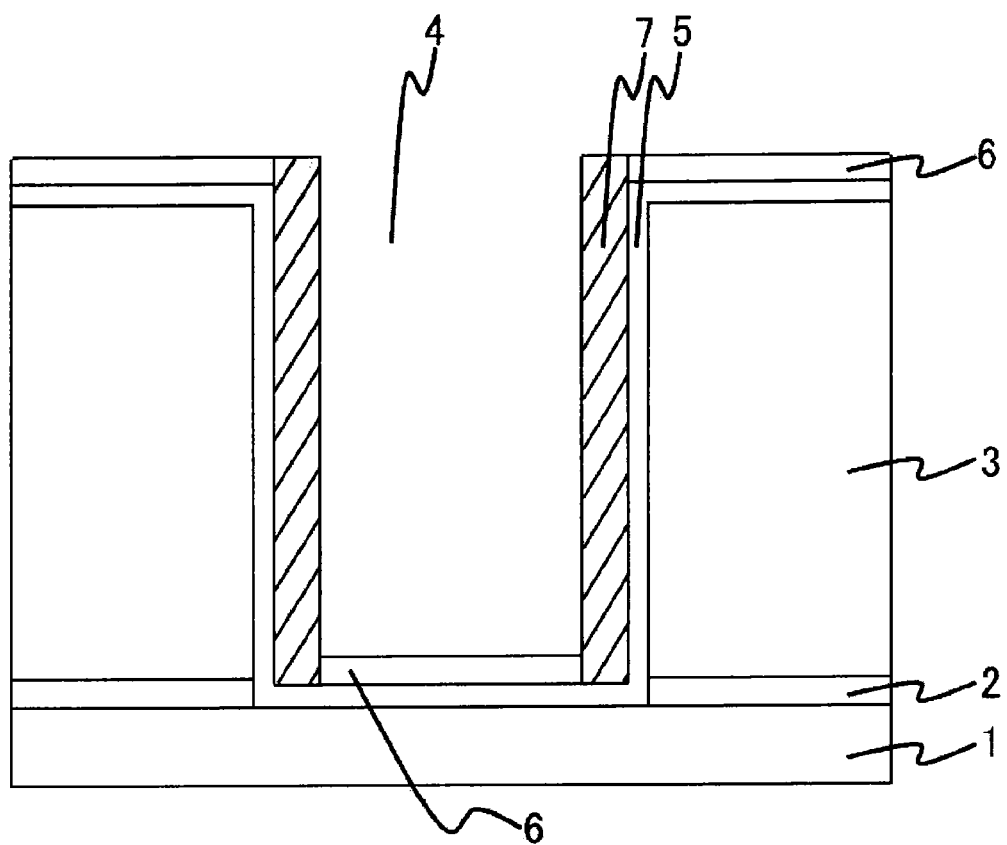
FIG. 9 is a step cross-sectional conceptual diagram of the method of manufacturing the wiring of the semiconductor device including the embodiment.

Next, as illustrated in FIG. 9, the catalyst metal film 7 on the bottom of the contact hole is thinned up to the film thickness suitable for the growth of the carbon nanotubes 8 by RIE (reactive ion etching) with high translation characteristics (anisotropy). At that time, it is etched such that the film thickness of the catalyst metal film 7 on the bottom of the contact hole is not less than 1 nm and not more than 4 nm. Since the etching with the high translation characteristics is performed, the side wall of the contact hole 4 is not easily etched and the catalyst metal film on the bottom of the contact hole and on an upper surface side of the interlayer insulating film is selectively etched. In the etching, etching time and the like may be adjusted based on the thickness of the catalyst metal film 6 estimated from film forming time and the like in advance. Therefore, it is possible to make the graphene 9 and the carbon nanotubes 8 on intended portions according to difference in thickness of the catalyst metal film at a subsequent carbon growth step by the etching at this step. Atomization of the catalyst metal film 6 is preferred for the growth of the carbon nanotubes 8 and from the viewpoint of the atomization of the catalyst metal film 6, the thickness of the catalyst metal film 6 is preferably not less than 1 nm and not more than 4 nm, for example. An extremely thin film such as the catalyst metal film 7 is aggregated to be atomized by thermal or plasma energy. The atomization of the catalyst metal film 6 is performed by the CVD or plasma treatment at a following step. This step adopts the etching with the high translation characteristics such that the film thickness of the catalyst metal film 7 formed on the side wall of the contact hole becomes the film thickness with which the growth of the graphene easily occurs or that a preferable film thickness is maintained.

Figure 10:
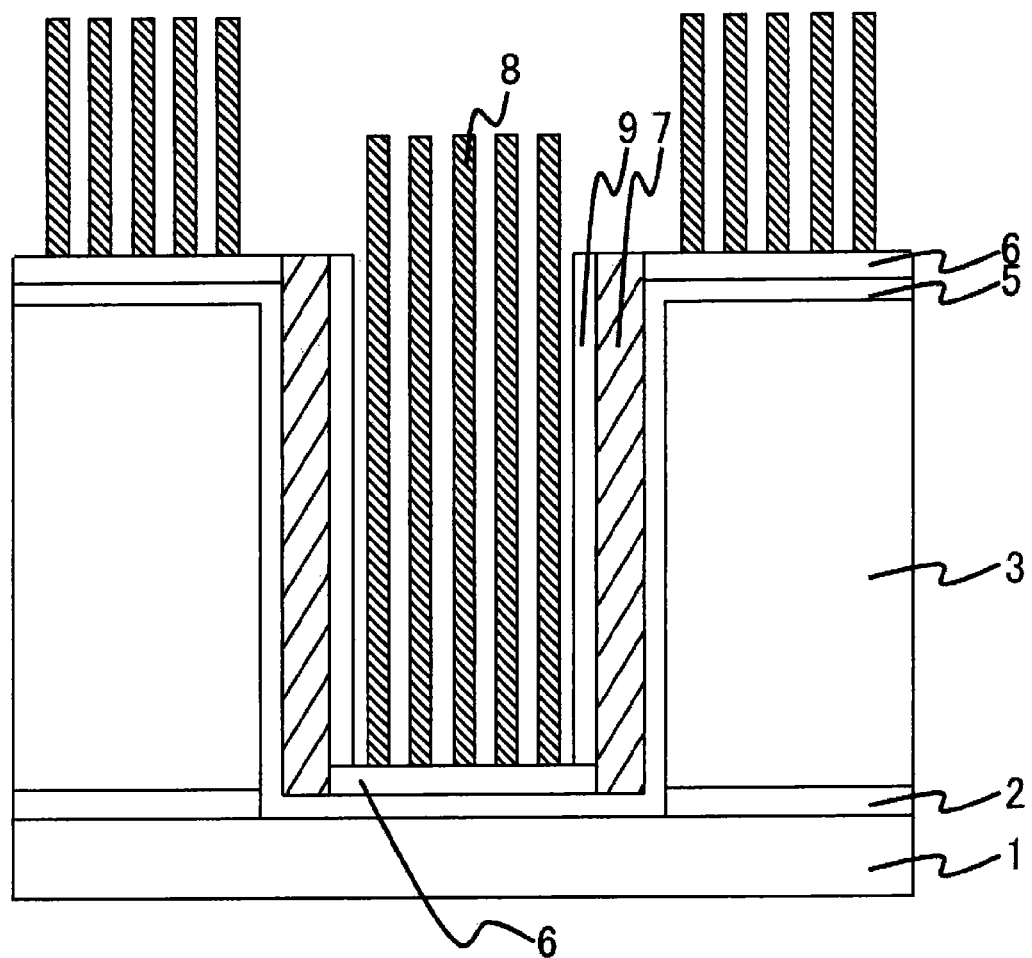
FIG. 10 is a step cross-sectional conceptual diagram of the method of manufacturing the wiring of the semiconductor device including the embodiment.

As illustrated in FIG. 10, the carbon nanotubes 8 are grown from the catalyst metal film 6 formed on the bottom of the contact hole and on an upper flat surface and the graphene 9 is grown from the catalyst metal film 7 formed on the side wall of the contact hole. The carbon nanotubes 8 and the graphene 9 are grown by a thermal CVD method and a plasma CVD method, for example. When the plasma CVD method is used, the substrate is heated up to 500° C., for example, in a reacting furnace, hydrocarbon gas such as methane gas as material gas and hydrogen as carrier gas are introduced, the methane gas is excited and discharged by a microwave, for example, to generate plasma of the material gas, and this is allowed to react with the catalyst metal film to grow the carbon nanotubes 8 and the graphene 9. At the time of the growth of the carbon nanotubes 8, the catalyst metal film 6 may be atomized by plasma surface treatment. The material gas of the plasma is preferably hydrogen or rare gas such as argon, for example; however, this may be mixed gas including any one of or both of them. At that time, the substrate may be heated.

Figure 11:
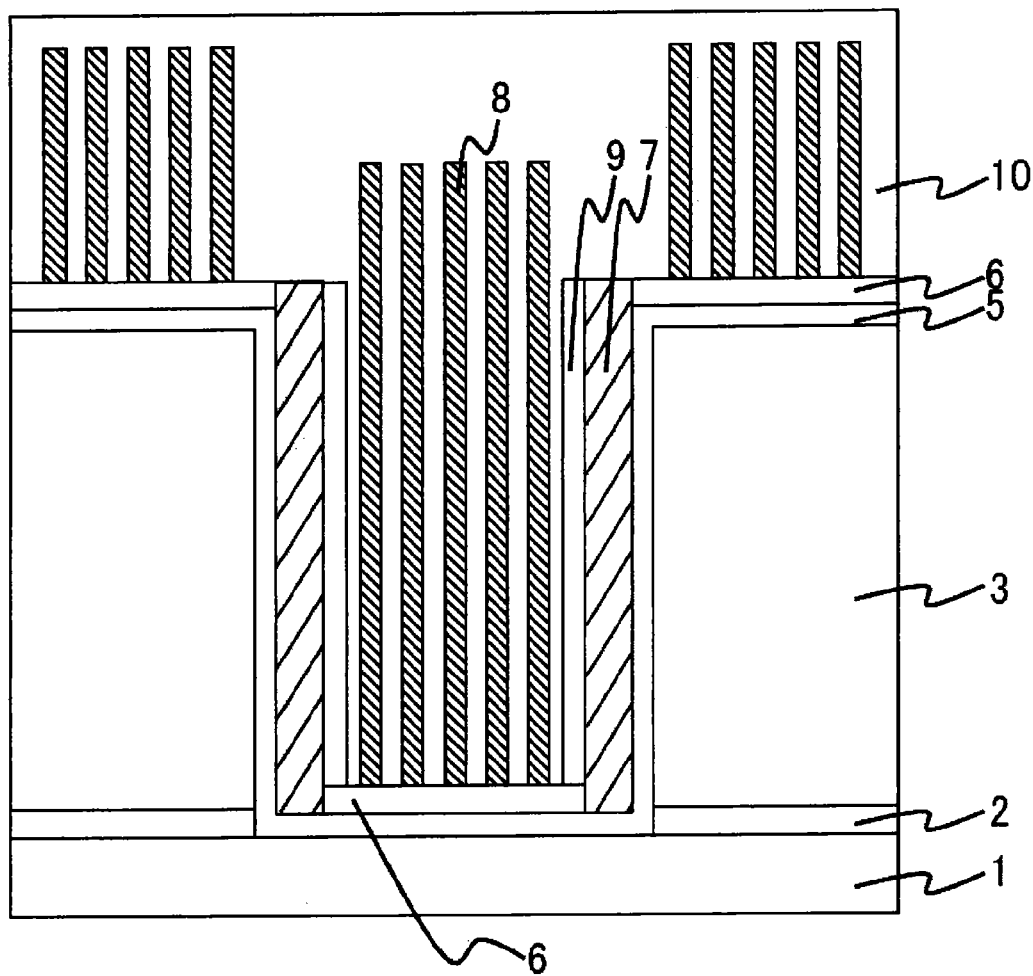
FIG. 11 is a step cross-sectional conceptual diagram of the method of manufacturing the wiring of the semiconductor device including the embodiment.

Next, an embedded film 10 is formed as illustrated in FIG. 11. The embedded film 10 is formed for fixing the carbon nanotubes 8 in order to polish in an excellent manner at the time of planarization by CMP. The embedded film 10 may be formed of an insulating material or a conductive material and an SOD being a coat-type insulating film, for example, is formed by spin coating. After the spin coating, it is hardened at 400° C., for example.

Then, it is possible to obtain the semiconductor device including a wiring structure in which the graphene 9 and the carbon nanotubes 8 are used illustrated in FIG. 1 by performing the planarization by the CMP and forming upper layer wiring 11 on the carbon nanotubes 8 and an upper portion of the embedded film 10 and on an edge of the conductive film 5, the catalyst metal film 7, and the graphene 9 formed on the side wall. At that time, the upper layer wiring 11 is desirably formed of a material such as Ti, for example, which may form an excellent contact with the carbon nanotubes 8 and the graphene 9.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a substrate on which a semiconductor circuit is formed and a contact hole, which penetrates an interlayer insulating film provided with the interlayer insulating film on the substrate;
    forming a conductive film on the contact hole;
    forming a catalyst metal film on the conductive film by a chemical vapor deposition method;
    depositing catalyst metal on a part of the catalyst metal film formed on a side wall of the conductive film by a physical vapor deposition method; and
    growing graphene and carbon nanotubes on the catalyst metal and a part of the catalyst metal film formed on a bottom of the conductive film, respectively.

2. A method of manufacturing a semiconductor device, comprising:
    forming a substrate on which a semiconductor circuit is formed and a contact hole, which penetrates an interlayer insulating film provided with the interlayer insulating film on the substrate;
    forming a conductive film on the contact hole;
    forming a catalyst metal film on the conductive film by a chemical vapor deposition method;
    thinning the catalyst metal film on a bottom of the conductive film; and
    growing graphene and carbon nanotubes on a part of the catalyst metal film formed on a side wall of the conductive film and the thinned catalyst metal film on the bottom of the conductive film, respectively.

3. The method according to claim 1, wherein the part of the catalyst metal film formed on the bottom of the conductive film is thinner than the part of the catalyst metal film on the side wall of the conductive film.

4. The method according to claim 2, wherein the part of the catalyst metal film formed on the bottom of the conductive film is thinner than the part of the catalyst metal film formed on the side wall of the conductive film.

5. The method according to claim 1, wherein an average thickness of the part of the catalyst metal film formed on the bottom of the conductive film is not less than 1 nm and not more than 4 nm.

6. The method according to claim 2, wherein an average thickness of the part of the catalyst metal film formed on the bottom of the conductive film is not less than 1 nm and not more than 4 nm.

7. The method according to claim 1, wherein an average thickness of the part of the catalyst metal film formed on the side wall of the conductive film is not less than 5 nm and not more than 10 nm.

8. The method according to claim 2, wherein an average thickness of the part of the catalyst metal film formed on the side wall of the conductive film is not less than 5 nm and not more than 10 nm.

9. The method according to claim 1, wherein an aspect ratio (depth/diameter) of the contact hole is not smaller than 2.

10. The method according to claim 2, wherein an aspect ratio (depth/diameter) of the contact hole is not smaller than 2.

11. The method according to claim 1, wherein the physical vapor deposition method is a sputtering method.

12. The method according to claim 1, wherein the part of the catalyst metal film formed on the bottom of the conductive film is atomized and the carbon nanotubes are grown from the atomized catalyst.

13. The method according to claim 2, wherein the part of the catalyst metal film formed on the bottom of the conductive film is atomized and the carbon nanotubes are grown from the atomized catalyst.

14. The method according to claim 1, wherein the part of the catalyst metal film formed on the side wall of the conductive film is not atomized and the graphene is grown from the catalyst, which is not atomized.

15. The method according to claim 2, wherein the part of the catalyst metal film formed on the side wall of the conductive film is not atomized and the graphene is grown from the catalyst, which is not atomized.

\* \* \* \* \*